United States Patent
Stein et al.

(10) Patent No.: US 7,525,459 B2
(45) Date of Patent: Apr. 28, 2009

(54) SIMPLIFIED PROGRAMMABLE COMPUTE SYSTEM FOR EXECUTING AN H.264 BINARY DECODE SYMBOL INSTRUCTION

(75) Inventors: Yosef Stein, Sharon, MA (US); Joshua A. Kablotsky, Carlisle, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/788,095

(22) Filed: Apr. 19, 2007

(65) Prior Publication Data

US 2008/0258948 A1 Oct. 23, 2008

(51) Int. Cl.
*H03M 7/00* (2006.01)
(52) U.S. Cl. .......................... 341/106; 341/50
(58) Field of Classification Search .............. 341/50, 341/51, 107, 106
See application file for complete search history.

(56) References Cited

U.S. PATENT DOCUMENTS

| | | | | |
|---|---|---|---|---|
| 5,404,140 A | * | 4/1995 | Ono et al. ............... | 341/107 |
| 6,876,317 B2 | * | 4/2005 | Sankaran ............... | 341/107 |
| 6,952,764 B2 | | 10/2005 | Sager et al. | |
| 7,054,493 B2 | * | 5/2006 | Schwartz ............... | 382/232 |
| 7,183,951 B2 | * | 2/2007 | Bossen ............... | 341/107 |
| 2005/0010623 A1 | | 1/2005 | Ku | |
| 2008/0075376 A1 | | 3/2008 | Wilson et al. | |

OTHER PUBLICATIONS

U.S. Appl. No. 11/527,001, filed Sep. 26, 2006, Wilson et al.
U.S. Appl. No. 11/788,094, Wilson et al.

* cited by examiner

*Primary Examiner*—R. Barnie
*Assistant Examiner*—Peguy Jean Pierre
(74) *Attorney, Agent, or Firm*—Iandiorio Teska & Coleman

(57) ABSTRACT

An improved programmable compute system and method for executing an H.264 binary decode symbol using only a single instruction and two compute units is achieved by providing not just one rLPS value but all four next possible rLPS values of the current context next state so that there is no delay initially while calculating the correct rLPS because all four are present and any one can be chosen; further all the parameters e.g. value, range, context, and rLPS can be served by only two available 32 bit registers by generating, locally, the MSP ninth bit of range based on the fact that the range is normalized to a known value in the MSB.

13 Claims, 7 Drawing Sheets

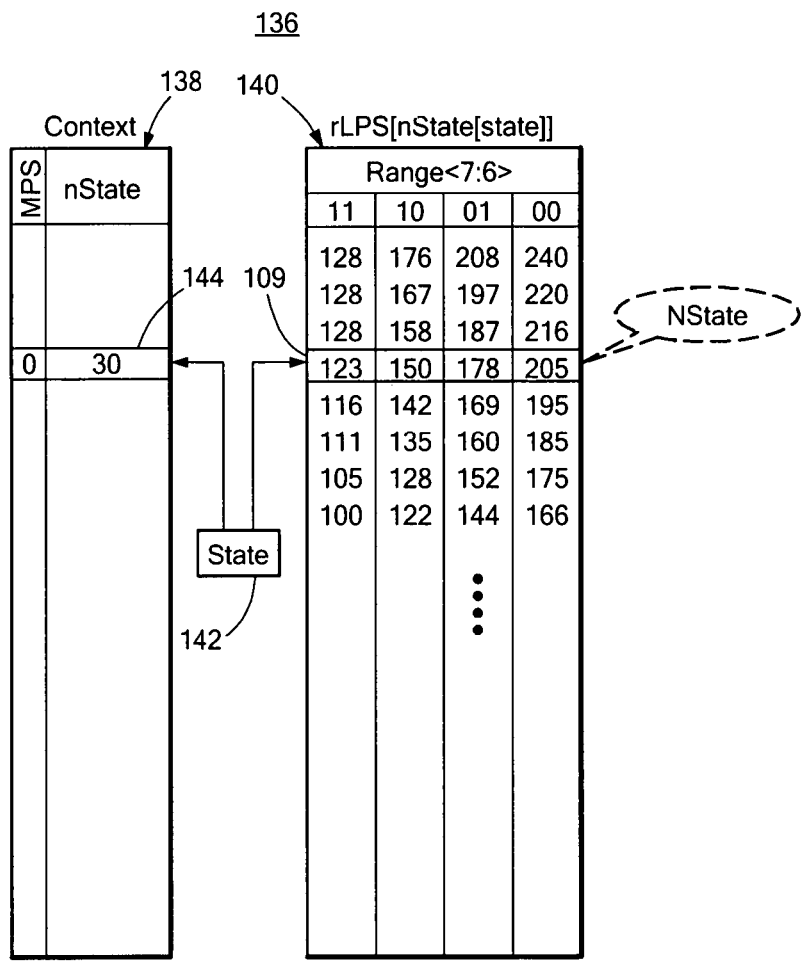
*FIG. 4*
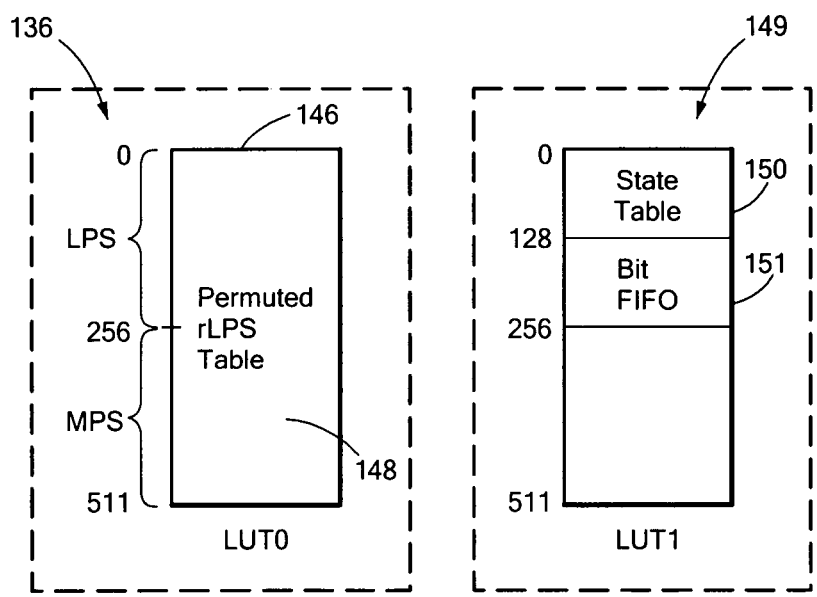
*FIG. 5*    *FIG. 6*

SIMPLIFIED PROGRAMMABLE COMPUTE SYSTEM FOR EXECUTING AN H.264 BINARY DECODE SYMBOL INSTRUCTION

FIELD OF THE INVENTION

This invention relates to a programmable compute system and method for executing an h.264 binary decode symbol.

BACKGROUND OF THE INVENTION

Arithmetic coding processes such as JPEG2000, JPEG, On2, or H.264 often use Context-based Adaptive Binary Arithmetic Coding (CABAC). The original principle of binary arithmetic coding is based on recursive subdivision of the interval width Range. [For a full description of the H264 CABAC standards and details see ITU-T Series H: Audiovisual and Multimedia Systems Infrastructure of audiovisual-coding of moving video]. Given the estimation of probability $p_{LPS}$ of Least Probable Symbol (LPS), the interval is subdivided into two subintervals: one interval width rLPS =Range $p_{LPS}$ which is associated with the LPS, and the other interval width rMPS=Range−rLPS, which is assigned to the Most Probable Symbol (MPS). Depending on whether the observed bit to be encoded is MPS or LPS, the corresponding subinterval is chosen as the new interval. The binary arithmetic coding process keeps updating the interval width register Range which marks the range of the interval and the code register Value which marks the lower bound of the interval. According to H.264 CABAC process, the Range $p_{LPs}$ required to perform the interval subdivision is approximated using a 4×64 2-D pre-stored table. Range value is approximated by four quantized values (2-bits) using an equal-partition of the whole range $2^8 \leq Range \leq 2^9$ and the value of pLPS is approximated by 64 quantized values indexed by a 6-bit MPS or LPS state. If the code offset (Value) is less than the current Range, the MPS path is taken where the most probable symbol (MPS) is designated as the next output bit, and the state transition is preformed based on the most probable symbol (MPS) look-up table. If Value is greater than current range, the LPS path is taken where the MPS bit is inverted, the current Value is determined from the previous Value and the range, then range becomes rLPS. If the current LPS state equals zero, the MPS is inverted, and the state transition is performed based on the least probable symbol (LPS) look-up table, followed by the renormalization process where the range and value are renormalized. Range is renormalized to the [511,256] interval by left-shifting range the required amount of bits; the Value is scaled up accordingly and the lower bits are appended from the incoming bit stream. One approach suggested in co-pending application U.S. patent application Ser. No. 11/527,001, filed Sep. 26, 2006, entitled "Iterative Process with Rotated Architecture for Reduced Pipeline Dependency" (AD-473), and co-pending U.S. patent application Ser. No. 11/788,094 filed on Apr. 19, 2007 entitled "A Programmable Compute System for Executing an H.264 Binary Decode Symbol Instruction" (AD-505J), each of which are incorporated by reference herein uses three compute units to solve the algorithm in a single instruction or two compute units with two instructions. While that was a significant improvement, it still required significant power and area if three compute units are used or twice as many MIPS (Million Instructions Per Second).

BRIEF SUMMARY OF THE INVENTION

It is therefore an object of this invention to provide an improved programmable compute system and method for executing an H.264 binary decode symbol.

It is a further object of this invention to provide such an improved programmable compute system and method for executing an H.264 binary decode symbol which requires only two compute units and a single instruction.

It is a further object of this invention to provide such an improved programmable compute system and method for executing an H.264 binary decode symbol which removes the rLPS dependency from the look-up table by providing the context with all four possible rLPS values for the current context state.

It is a further object of this invention to provide such an improved programmable compute system and method for executing an H.264 binary decode symbol which has twice the speed and requires only half the area.

It is a further object of this invention to provide such an improved programmable compute system and method for executing an H.264 binary decode symbol which uses less of the available look-up table space.

It is a further object of this invention to provide such an improved programmable compute system and method for executing an H.264 binary decode symbol in which all the parameters, e.g. value, range, context and rLPS are provided in only the two available 32 bit registers.

It is a further object of this invention to provide such an improved programmable compute system and method for executing an H.264 binary decode symbol in which one register provides all four possible rLPS values of the current context states and the other register provides a 16 bit field for value, 8 bit range field and 8 bit context field including state and MPS.

It is a further object of this invention to provide such an improved programmable compute system and method for executing an H.264 binary decode symbol in which the range input is an 8 bit value with the MSB ninth bit being locally generated based on the fact the range is normalized to a known value.

It is a further object of this invention to provide such an improved programmable compute system and method for executing an H.264 binary decode symbol in which both value and range can be normalized in parallel using but one shifter.

It is a further object of this invention to provide such an improved programmable compute system and method for executing an H.264 binary decode symbol which uses the compute unit look up table for storing the rLPS, MPS and LPS state table and saves area and power.

It is a further object of this invention to provide such an improved programmable compute system and method for executing an H.264 binary decode symbol which uses the compute unit lookup table for implementing the arithmetic coding bit stream FIFO.

It is a further object of this invention to provide an improved programmable compute system and method for executing an H.264 binary decode symbol which rotates the H.264 arithmetic coding algorithm to best fit the compute unit hardware dependencies.

It is a further object of this invention to provide such H.264 decoding arithmetic coding symbol instruction which uses existing compute units.

This invention results from the realization that an improved programmable compute system and method for executing an H.264 binary decode symbol using only a single instruction and two compute units can be achieved by providing not just one rLPS value but all four next possible rLPS values for the next state of the current context so that there is no delay initially while calculating the correct rLPS because all four are present and any one can be chosen. The invention further realizes that all the parameters e.g. value, range, context, and rLPS can be served by only two available 32 bit registers by generating, locally, the MSB ninth bit, of range based on the fact that the range is normalized to a known value in the MSB.

The subject invention, however, in other embodiments, need not achieve all these objectives and the claims hereof should not be limited to structures or methods capable of achieving these objectives.

This invention features a programmable compute system for executing an h.264 binary decode symbol instruction including a first compute unit having a first range circuit responsive to four possible current rLPS values for selecting the current rLPS value in accordance with the current range value to define the current rLPS and, in response to the selected current rLPS value and the current range value, calculating the MPS range. A next state rLPS circuit is responsive to the MPS range and current values to generate a flag and includes a first look-up table responsive to the flag and the state of the current context value to generate the next four possible rLPS values of the current context next state. A second compute unit includes a second range circuit responsive to four possible current rLPS values for selecting the current rLPS value in accordance with the current range value to define the current rLPS and, in response to the selected current rLPS value and the current range value, calculating the MPS range; and in response to the flag selecting one of the MPS and LPS ranges. A value update circuit, responsive to the current value and the difference between the current range and current rLPS calculates MPS and LPS value values and responsive to the second flag selects one of them. A value normalization circuit, responsive to the selected range value and the selected value value provides in parallel the normalized next value and next range. A current context update circuit is responsive to current context MPS and state, for determining MPS and LPS state from a second look up table and selecting one of them in response to the flag and generating an MPS and negated MPS bit and providing the next context MPS and state and the decode symbol.

In a preferred embodiment the first range circuit may include a first selection circuit for selecting one of four current rLPS values for the current rLPS range in accordance with the current range value and a subtraction circuit for generating the MPS range from the current range and the current rLPS. The next state rLPS circuit may include a decision circuit responsive to the MPS range and current value to generate the flag and the first look-up table may contain the four possible rLPS values for each state which are permuted according to the next state of current state. The first look-up table may respond to the state and the flag to provide the four possible values for the next state of the current context. The first look-up table may include an MPS and LPS state table and the flag may determine which table will be addressed. The range circuit input may be an eight bit value and the current range most significant bit may be locally generated. The second range circuit may include a first selection circuit for selecting one of four current rLPS values for the current rLPS range in accordance with the current range value; a subtraction circuit for generating the MPS range from the current range and the current rLPS; and a second selection circuit responsive to the flag for selecting one of the LPS and MPS ranges. The normalization circuit may include a leading zero detection circuit responsive to the selected range value, a shift circuit responsive to the number of leading zeros from the leading zero detection circuit the selected value value, the selected range value for shifting in parallel the range value and value value and a bit FIFO for appending the number of leading zeros to the shifted value value to generate the next value and next range. The second look up table may include a state table and a bit FIFO. The current context may include the most probable symbol, state, and the four possible rLPS values of the context state.

This invention also features a method of operating a compute system for executing an H.624 binary decode symbol instruction including selecting, from four possible current rLPS values, the current rLPS value in accordance with the current range value to define the current rLPS. The MPS range is calculated from the selected current rLPS value and the current range value. A flag is generated from the MPS range and current value. The next four possible rLPS values of then current context next state are generated from a look-up table in response to the flag and the state of the current context value. One of the MPS and LPS ranges is selected in response to the flag. MPS and LPS value values are calculated in response to the current value and the difference between the current range and current rLPS. The selected range value and value value are normalized in parallel to provide the next value and range. The MPS and LPS state are determined from current context MPS and state from a second look-up table. One of them is selected in response to the flag and an MPS and negated MPS bit are generated providing the next context MPS and state and decode symbol.

This invention also features a method of executing an H.264 binary decode symbol including selecting, from four possible current rLPS values, the current rLPS value in accordance with the current range value to define the current rLPS, calculating the MPS range from the selected current in rLPS value and the current range value and comparing the MPS range and current value to determine an MPS or LPS path. In the MPS path the next state of the current context is generated from an MPS state look-up table and in the LPS path the next state of the current context is generated using the LPS state look-up table. Range is updated to the selected current rLPS value and value is updated from the current value and MPS range. From a permutated look-up table the next four possible rLPS values of the current context next state are obtained and the range and value are normalized to obtain next range, next rLPS, next value, next context and the output bit.

In a preferred embodiment the current context may include the most probable symbol, state, and the four possible rLPS values of the context state.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIG. 4 is a diagrammatic view of an rLPS as a function of the next state of the current context look up table useable in FIG. 3;

FIG. 5 shows the allocation of the look up table of FIG. 4 within the compute unit internal lookup table space;

FIG. 6 is a diagrammatic view of the MPS, LPS state lookup table and the bit FIFO allocation within the compute unit internal lookup table space, a portion of which is usable in the process of FIG. 3;

DETAILED DESCRIPTION OF THE INVENTION

Figure 1:
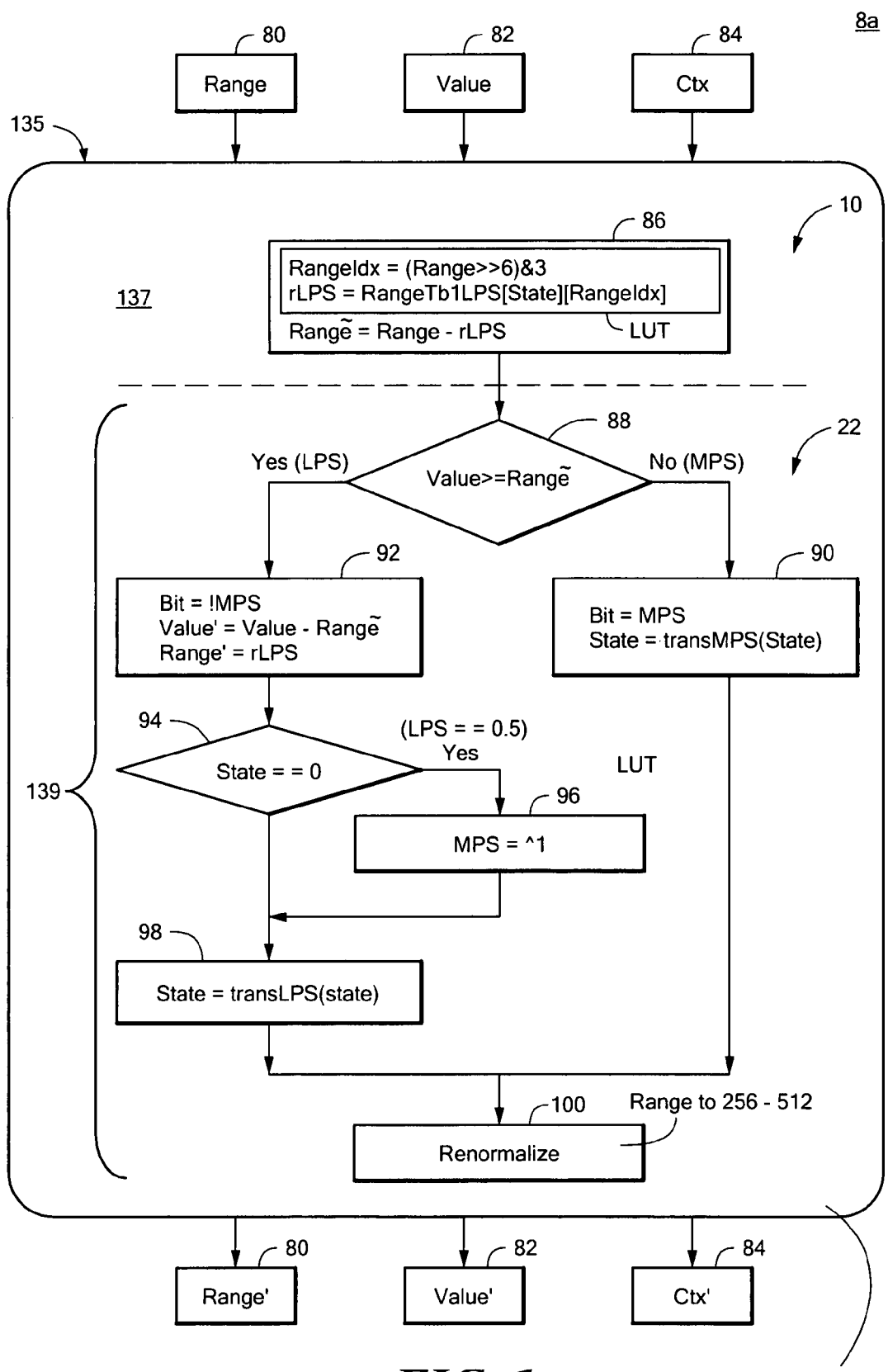
FIG. 1 is a flow block diagram of a prior art method of H.264 CABAC decoding.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

In a H.264 CABAC process 8a, FIG. 1, there are three inputs, present range 80, value 82, and context 84. In the first step 86, rLPS and intermediate range~ are calculated. rLPS is typically generated using a 4×64 2D look-up table in an associated compute unit. In step 88 it is determined as to whether value is greater than the intermediate range~. If it is not greater than the intermediate range~, the Most probable symbol path is taken where in step 90 MPS is assigned as the output bit and the state of the context is updated using a second look-up table (the MPS-transition table). If the value is greater that the range the Least probable symbol path is taken where in step 92 an inverted MPS is assigned as the output bit, the next value is calculated from the value and the intermediate range~ and the next range is determined from the rLPS. Following this in step 94, if the state is equal to zero the MPS is negated in step 96. If state is not equal to zero following step 94, or following step 96, a new state is determined 98 from a third look-up table (the LPS-transition table). Finally, whether the value is greater than or less than the range, the respective outputs are renormalized 100 to a range between 256 and 512, the Value is scaled up accordingly and the new LSB bits of Value are appended from the bit stream FIFO. The outputs resulting then are the normalized next range, range', normalized next value, value', and next context, context'. The operation of process 8a is effected by arithmetic decoder 135.

In contrast CABAC decoder processor 30a in accordance with the inventions of U.S. patent application Ser. No. 11/527, 001, filed Sep. 26, 2006, entitled "Iterative Process with Rotated Architecture for Reduced Pipeline Dependency" (AD-473) and U.S. patent application Ser. No. 11/788,094 filed Apr. 19, 2007, entitled "A Programmable Compute System for Executing an H.264 Binary Decode Symbol Instruction" (AD-505J), each of which are incorporated by reference herein, FIG. 2, has four inputs, present range, 102, present rLPS 104, present value 106, and present context 108. In the process 30a according to this invention the present rLPS 104 is supplied either externally initially, and then once the operation is running, by the preliminary generation of the next rLPS'. With the rLPS being supplied the dependency of range~ on the two dimensional state/range look-up table of rLPS result is resolved, and the intermediate range~ is determined from the present range and the present rLPS in step 110. Then in step 112 it is determined whether the value is greater than the intermediate range, if it is not, once again the Most probable symbol path is taken where in step 114 the MPS is assigned to a bit and the state of the context is updated by reference to a first MPS-transition look-up table. If the value is greater than the intermediate range then the Least probable symbol path is taken where MIPS has assigned to it the inverted bit, next value' is determined from present value and intermediate range~ and the next range' is determined from the rLPS. In step 118 inquiry is made as to whether the state is equal to zero. If it is the MPS is negated in step 120. In step 122 the new context state is determined from a second LPS-transition look-up table. In either case in step 124 the system is renormalized as previously explained. Then in 126 the first two operations in step 86 of the prior art device, FIG. 4, are now performed. There in step 126 the next rLPS, rLPS', is determined from the normalized next range' and the updated context next state' using a third 2D look-up table. The output then is the next range, range' 128 the next rLPS, rLPS' 130, the next value, value' 132, and the next context, context' 134. The operation of process 30a is effected by arithmetic decoder 135a.

Figure 2:
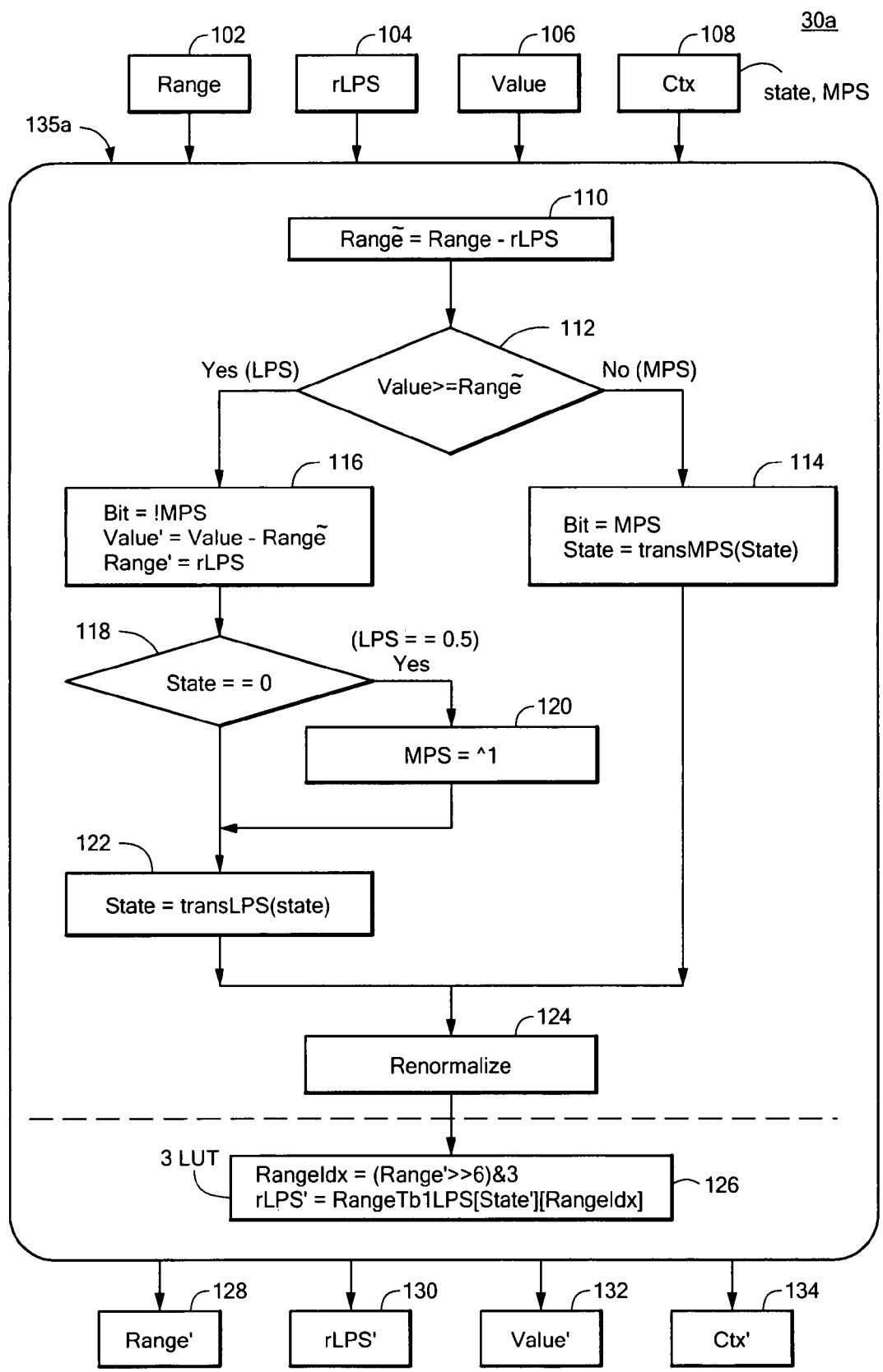
FIG. 2 is a flow block diagram of a method of H.264 CABAC decoding according to the invention of co-pending application Ser. No. 11/527,001 (AD-473J)

Note that the next rLPS', which is anticipatorily generated as shown in FIG. 2, is based on a particular context value 108. As long as this context is going to be used in the next iteration the anticipatory next rLPS, rLPS' being calculated in advance is proper. However, occasionally context itself may change in which case a new context next rLPS' or, rLPS" will have to be created for the new context.

Figure 3:
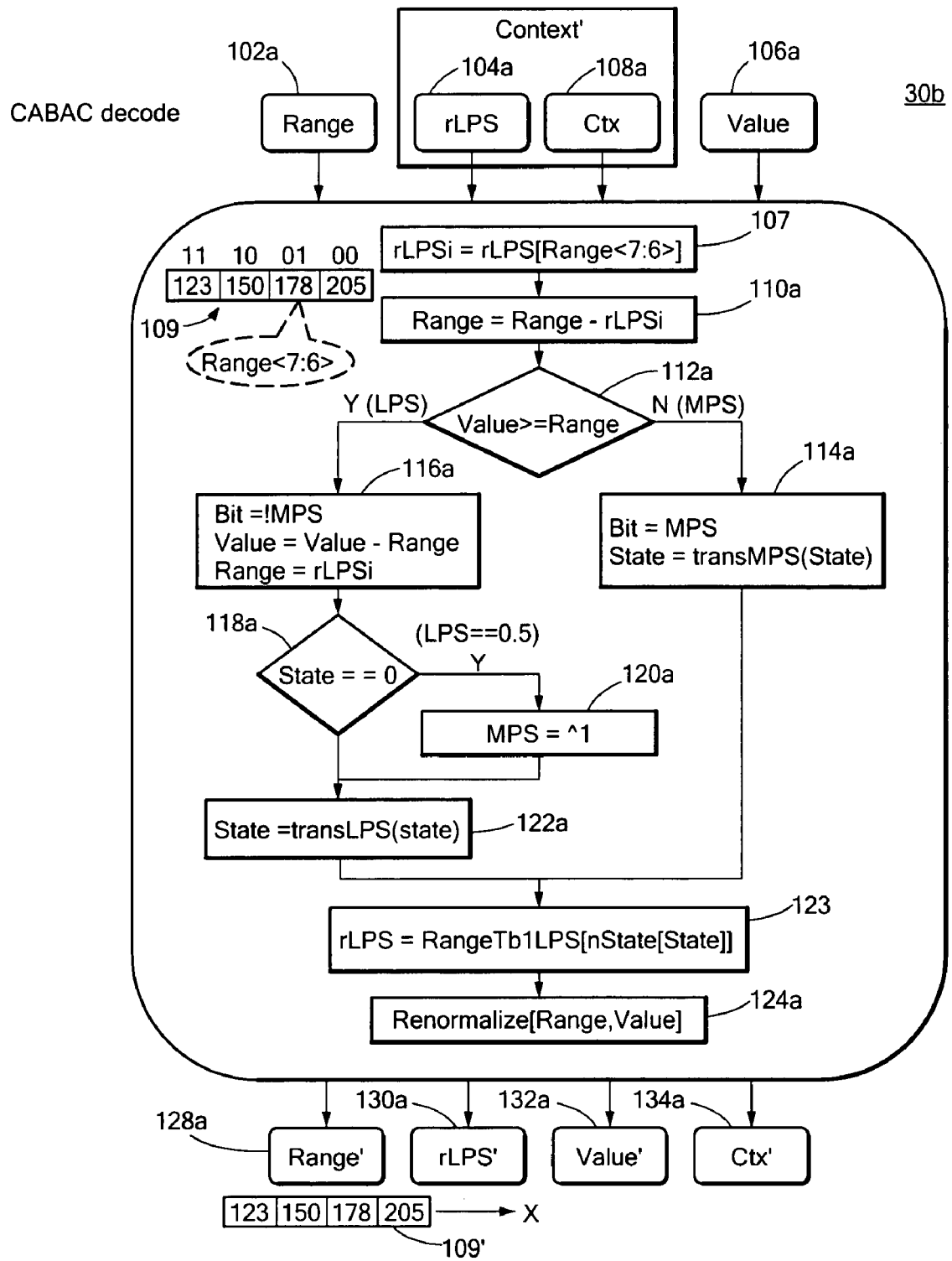
FIG. 3 is a flow block diagram of a method of H.264 CABAC decoding according to this invention.

In accordance with the process 30b, FIG. 3, of this invention the values of range, 102a, rLPS 104a, context 108a and value 106a are still presented but now the context includes both rLPS and context 105 and the rLPS input has not just the current rLPS value but all four of the rLPS values for the context state. Thus the dependency of rLPS on the current context state is resolved; there is no need to calculate the next rLPS with the incumbent delay: it can merely be chosen in accordance with the range<7:6>. Significantly, this means that the third compute unit required in U.S. Ser. No. 11/527, 001, filed Sep. 26, 2006, entitled "Iterative Process with Rotated Architecture for Reduced Pipeline Dependency" (AD-473), and U.S. patent application Ser. No. 11/788,094, filed Apr. 19, 2007, entitled "A Programmable Compute System for Executing an H.264 Binary Decode Symbol Instruction" (AD-505J), each of which are incorporated by reference herein, is no longer required to determine the next rLPS" for a new context and so the third compute unit (or reconfiguration of the first compute unit to function as a third compute) is not necessary and only one instead of two instructions are necessary. Process 30b, FIG. 3, operates just as process 30a, FIG. 2, but in step 107 with all four of the rLPS values present 109, one is chosen in accordance with the range<7:6>. Then the process proceeds as previously explained. But in step 123, not one but all four next rLPS values 109' are determined in anticipation of the next operation.

The four possible rLPS values are generated by permuted look-up table 136, FIG. 4 including context section 138 and rLPS section 140. Lookup table 136 is responsive to the flag and the state of the current context value to generate the next four possible rLPS values of the current context next state.

From the current state 142, section 138 provides the next state 144. From that, all four of the rLPS values 109 for the next state are retrieved and all four are presented at rLPS 104a, FIG. 5. Look-up table 136 is actually portioned in two parts: LPS 146 and MPS 148. A second look-up table 149, FIG. 6, is also employed in the process 30b, only half of it is used to provide the MPS, LPS state tables 150 and bit FIFO 151.

Figure 7:
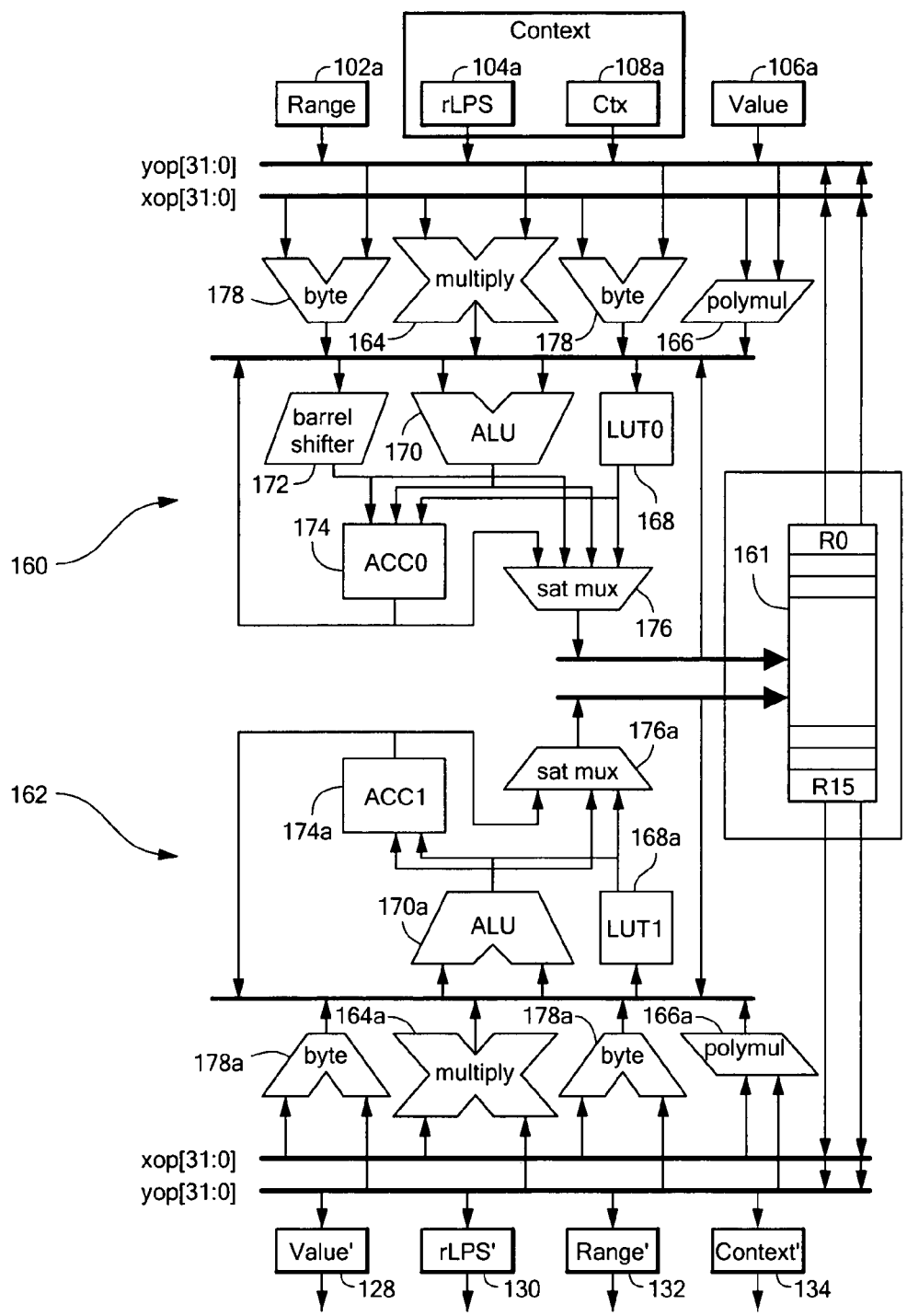
FIG. 7 is a schematic block diagram of an arithmetic processor with two compute units for implementing this invention.

Process 30b, FIG. 3, may be implemented in a pair of compute units 160, 162, FIG. 7, each including a variety of components including e.g., multiplier 164, polynomial multiplier 166, look-up table 168, arithmetic logic unit 170, barrel shifter 172, accumulator 174, mux 176, byte ALUs 178. Compute units 160, 162 perform the method or process 30b of FIG. 3, and look-up tables 168, 168a fill the role of the necessary look-up tables in steps 123, and 114a and 122a referred to in FIG. 3. Compute units 160, and are accessed through register file 161.

Figure 8:
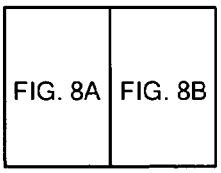
FIG. 8 is a key to FIGS. 8A and 8B which are schematic block diagram of first and second compute units in a programmable compute system for executing an H.264 binary decode symbol instruction according to this invention.
Figure 8A:
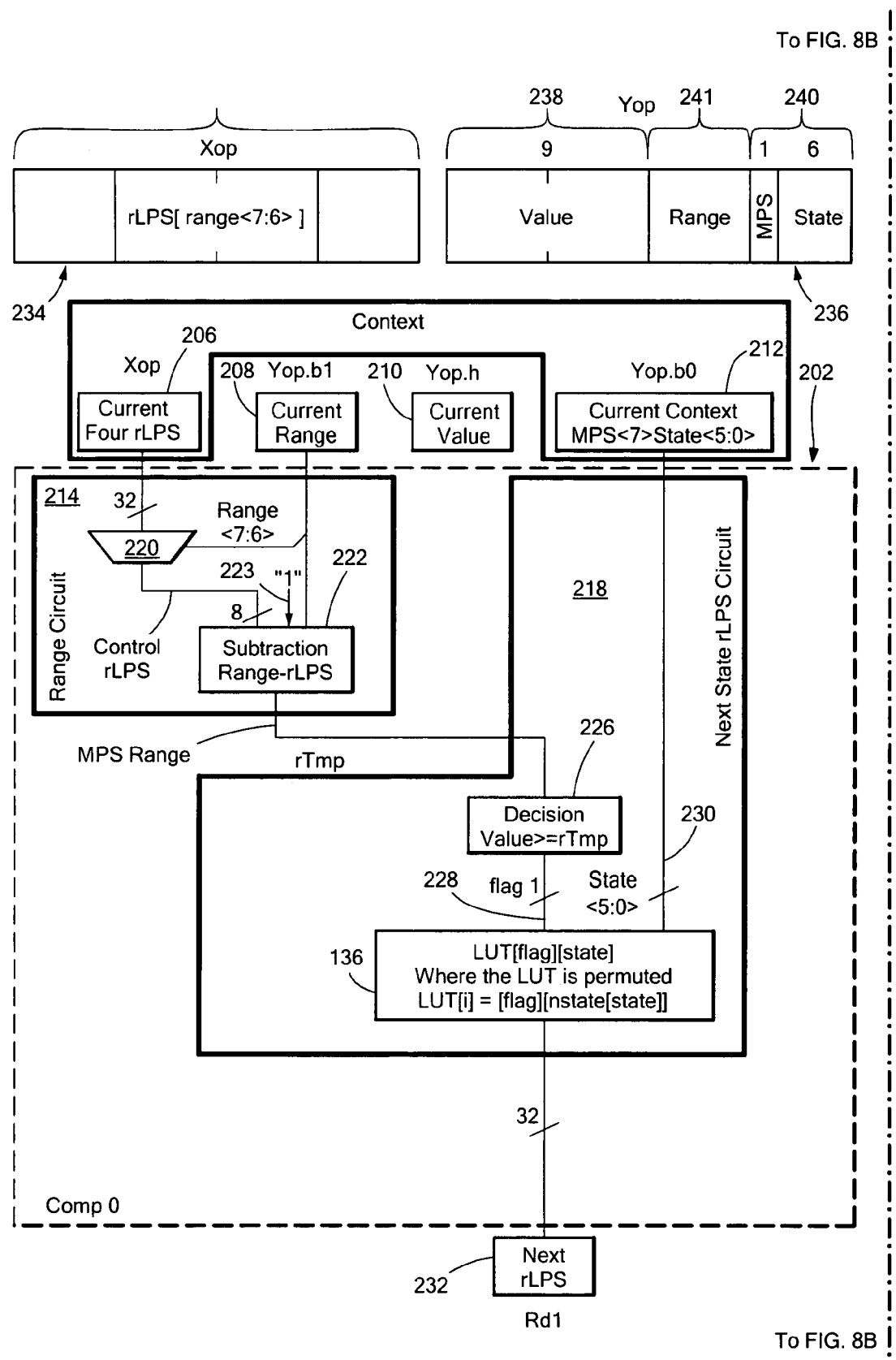
Figure 8B:
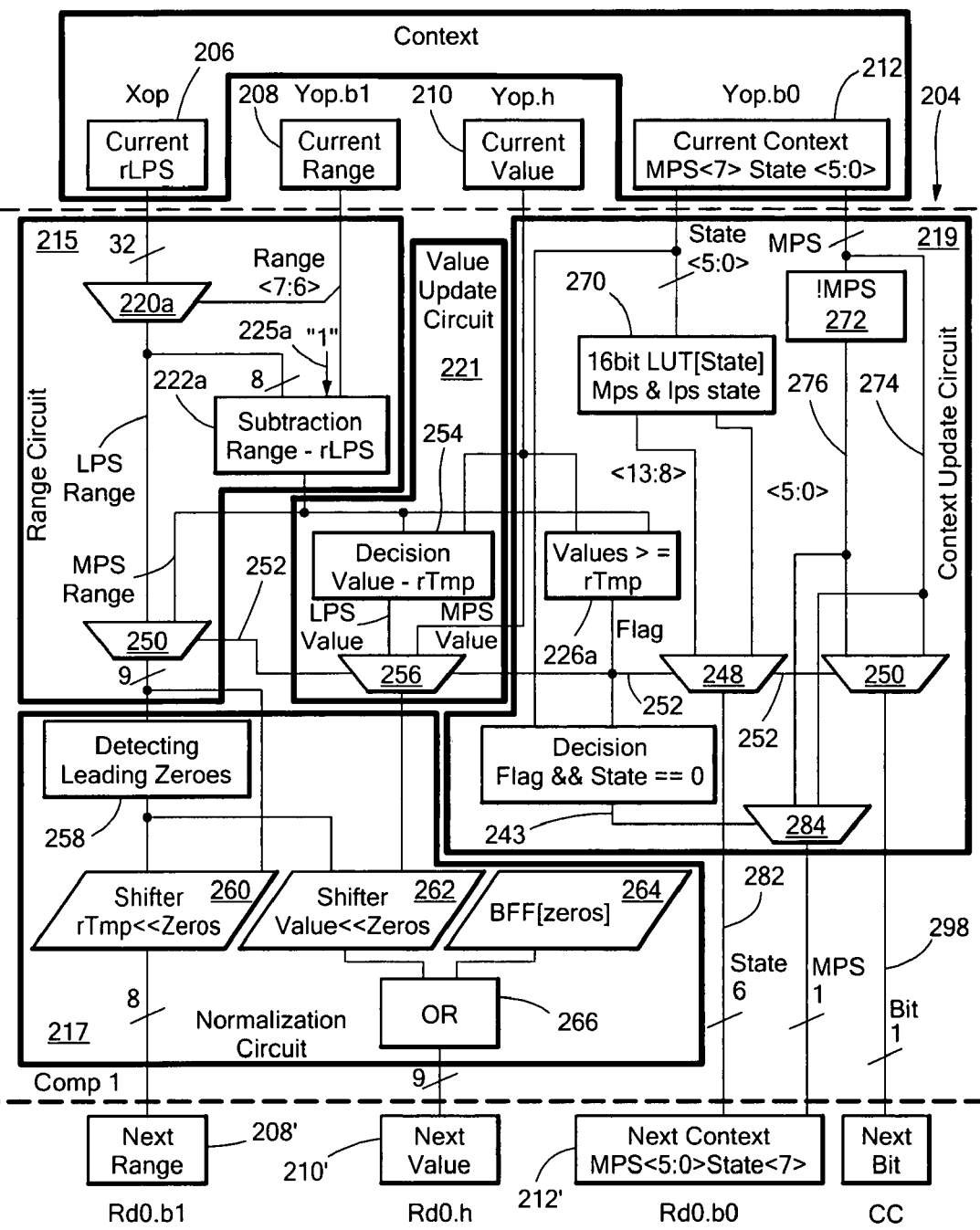

FIG. 8 is a key to FIGS. 8A and 8B which together show one implementation of the programmable compute system for executing an H.264 binary decode symbol instruction in accordance with this invention 200. There is a first compute unit 202 and a second compute unit 204. The first compute unit 202 receives four inputs rLPS 206, range 208, value 210, and context 212. Note that the context now includes rLPS 206 and context 212. Note also that it receives all four rLPS values at 206. The first compute unit includes a range circuit 214, and next state rLPS circuit 218. Range circuit 214 includes a selection circuit 220, which selects one of the four rLPS values in accordance with range<7:6> to provide the current rLPS. Range circuit 214 also includes a subtraction circuit 222 which responds to the current rLPS input 224 from selection circuit 220 and current range 208 to determine the MPS range 226.

Next state rLPS circuit 218 includes a decision circuit 226 and look up table 136. Decision circuit 226 responds to MPS range from subtraction circuit 222 and current value 210 to develop flag 228 which together with the current state 230 from context 212 addresses the four possible rLPS values in look-up table 136 to provide the next four possible rLPS values for the next context state 232.

Compute unit 204 receives the same inputs rLPS 206, range 208, value 216 and context 212 and has a range circuit 215, normalization circuit 217 and context update circuit 219 and value update circuit 221. Range circuit 215 is similar to range circuit 214 but includes in addition a selection circuit 250 which responds to the current rLPS from selection circuit 220a, which is the LPS range, and the MPS range from subtraction circuit 222a to provide one of those as an output in accordance with the flag on line 252. This is the same flag as generated by decision circuit 226 and is used throughout both compute units 202 and 204.

Value update circuit 225 includes a decision circuit 254 which responds to the MPS range from subtraction unit 222a and current value 210 to produce both LPS value and MPS value to selection circuit 250 which chooses one in accordance with the flag on line 252 generated from decision circuit 226a.

Normalization circuit 217 includes a leading zero detector circuit 258, rLPS shifter 260, value shifter 262, bit FIFO 264 and ORgate 266. Leading zero detector circuit 258 detects the leading zeros in the selected MPS or LPS range for selection circuit 250 and causes shifters 260 and 262 to simultaneously shift range and value thereby accomplishing both in one operation. range shifter 260 then output the next range 208' while the absent value bits are supplied by bit FIFO 264 and the OR circuit 266 appends them to value which then provides the next value 210'.

One obstacle to the realization of this invention was the compute unit constraint of having to work with only two 32 bit input registers addressable only in eight, sixteen and thirty two bits. Thus first 32 bit register 234 can accommodate the four possible current context rLPS values 8 bit each but the second 32 bit register 236 has to accommodate a nine bit "value" which uses a 16 bit section 238, while MPS and state with seven bits use another eight bit section 240. This leaves only one eight bit section 241 for the nine bits of range value.

However, it was realized that since the range and value have been normalized as in normalization circuit 217 by shifting out the leading zeros the MSB must necessarily be a "one". Therefore, only the least significant 8 bits of range need be stored in register 236 because the most significant ninth bit can be locally generated as "1" and provided to subtraction units 222 and 222a at the "1" inputs 223 and 223a.

Current context update circuit 219 in second compute unit 204 includes a sixteen bit 64 entries look up table 270 which typically stores the MPS and LPS state transition tables as implemented in table 149, FIG. 6. Context input 212 includes rLPS, MPS and state values. The MPS value is delivered to negater circuit 272 and to selector circuit 250. The other input to selector circuit 250 comes from negater circuit 272 so that it receives the MPS signal on line 274 and negated MPS signal on line 276. One of these is selected in accordance with the condition of the flag signal on line 252. The output, then, is the actual symbol output on line 278. Look up table 270 provides both the MPS and LPS states to selector circuit 248 and the condition of the flag signal on line 252 determines which of the MPS or LPS state will be selected. That state is delivered to the next context output 212' on line 282 and will be the state for the next context. Similarly the MPS and negated MPS signals on lines 274 and 276, respectively, are delivered to selector circuit 284, which also responds to flag signal 243 that identifies if the LPS path was selected and the state equals zero, to select one of the two and provide it to the next context output 212' as the next MPS. Signal 243 is derived from decision circuit 245 flaged state =0> which responds to the current value 210 and flag 252.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A programmable compute system for executing an h.264 binary decode symbol instruction comprising:

a first compute unit including a first range circuit responsive to four possible current range of Least Probable Symbol (rLPS) values for selecting a current rLPS value in accordance with a current range value to define the current rLPS and, in response to said selected current rLPS value and said current range value, calculating a Most Probable Symbol (MPS) range; and a next state rLPS circuit responsive to said MPS range and current values to generate a flag and including a first look-up table responsive to said flag and a state of the current context value to generate the next four possible rLPS values of a current context next state; and a second compute unit including a second range circuit responsive to four possible current rLPS values for selecting the current rLPS value in accordance with the current range value to define the current rLPS and, in response to said selected current rLPS value and said current range value, calculating the MPS range; and in response to said flag selecting one of said MPS range and an LPS range; and a value update circuit, responsive to the current value and a difference between the current range and current rLPS for calculating MPS and LPS value values and responsive to said flag to select one of them; a value normalization circuit, responsive to said selected range value and a selected value value to provide in parallel a normalized next value, a next range; and a current context update circuit responsive to current context MPS and state, for determining MPS and LPS state from a second look-up table and selecting one of them in response to said flag and generating an MPS and negated MPS bit and providing the next context MPS and state and a decode symbol.

2. The programmable compute system of claim 1 in which said first range circuit includes a first selection circuit for selecting one of four current rLPS values for the current rLPS range in accordance with the current range value and a subtraction circuit for generating the MPS range from the current range and the current rLPS.

3. The programmable compute system of claim 2 in which said next state rLPS circuit includes a decision circuit responsive to said MPS range and current value to generate said flag and said first look-up table contains the four possible rLPS values for each state which are permuted according to the next state of current state.

4. The programmable compute system of claim 3 in said first look-up table responds to the state and said flag to provide the four possible values for the next state of said current context.

5. The programmable compute system of claim 3 in which said first look-up table includes an MPS and LPS state table and said flag determines which table will be addressed.

6. The programmable compute system of claim 1 in which said range circuit input is an eight bit value and a current range most significant bit is locally generated.

7. The programmable compute system of claim 1 in which said second range circuit includes a first selection circuit for selecting one of four current rLPS values for the current rLPS range in accordance with the current range value and a subtraction circuit for generating the MPS range from the current range and the current rLPS and a second selection circuit responsive to said flag for selecting one of said LPS and MPS ranges.

8. The programmable compute system of claim 1 in which said normalization circuit includes a leading zero detection circuit responsive to said selected range value, a shift circuit responsive to a number of leading zeros from said leading zero detection circuit the selected value value, the selected range value for shifting in parallel the range value and value value and a bit FIFO for appending the number of leading zeros to said shifted value value to generate said next value and next range.

9. The programmable compute system of claim 7 in which said second look up table includes a state table and a bit FIFO.

10. The programmable compute system of claim 1 in which said current context includes a most probable symbol, a state, and the four possible rLPS values of the context state.

11. A method of operating a compute system for executing an H.624 binary decode symbol instruction comprising:
selecting, from four possible current rLPS values, a current rLPS value in accordance with a current range value to define the current rLPS;
calculating an MPS range from the selected current rLPS value and the current range value;
generating a flag from a MPS range and current value;
generating, from a look-up table in response to the flag and a state of the current context value, the next four possible rLPS values of the current context next state;
selecting one of said MPS and LPS ranges in response to the flag;
calculating MPS and LPS value values in response to the current value and a difference between the current range and current rLPS;
normalizing in parallel a selected range value and a value value to provide a next value and range; and
determining from current context MPS and state, the MPS and LPS state from a second look-up table and selecting one of them in response to the flag and generating an MPS and negated MPS bit and providing a next context MPS and state and decode symbol.

12. A method of executing an H.264 binary decode symbol comprising:
selecting, from four possible current rLPS values, a current rLPS value in accordance with a current range value to define a current rLPS,
calculating an MPS range from the selected current rLPS value and the current range value;
comparing the MPS range and current value to determine an MPS or LPS path; in the MPS path generating the next state of the current context from an MPS state look-up table and in the LPS path generating the next state of the current context using the LPS state look-up table; updating range to the selected current rLPS value and updating value from the current value and MPS range;
obtaining from a permutated look-up table the next four possible rLPS values of a current context next state; and
normalizing the range and value to obtain a next range, a next rLPS, a next value, a next context and the output bit.

13. The method of executing an H.264 binary decode symbol of claim 12 in which said current context includes the most probable symbol, state, and the four possible rLPS values of the context state.

* * * * *

UNITED STATES PATENT AND TRADEMARK OFFICE
CERTIFICATE OF CORRECTION

PATENT NO. : 7,525,459 B2
APPLICATION NO. : 11/788095
DATED : April 28, 2009
INVENTOR(S) : Yosef Stein et al.

Page 1 of 1

It is certified that error appears in the above-identified patent and that said Letters Patent is hereby corrected as shown below:

Claim 9, column 10, line 10, please delete "7" and insert --1--.

Signed and Sealed this

Twenty-second Day of September, 2009

David J. Kappos
*Director of the United States Patent and Trademark Office*